US011452220B2

(12) United States Patent
Cho et al.

(10) Patent No.: US 11,452,220 B2
(45) Date of Patent: Sep. 20, 2022

(54) HOUSING AND ELECTRONIC DEVICE INCLUDING THE SAME

(71) Applicant: Samsung Electronics Co., Ltd., Suwon-si (KR)

(72) Inventors: Chongkun Cho, Suwon-si (KR); Sunggun Cho, Suwon-si (KR); Wonhee Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 17/152,076

(22) Filed: Jan. 19, 2021

(65) Prior Publication Data

US 2021/0144866 A1 May 13, 2021

Related U.S. Application Data

(63) Continuation of application No. 16/750,693, filed on Jan. 23, 2020, now Pat. No. 10,897,827.

(30) Foreign Application Priority Data

Feb. 1, 2019 (KR) .................. 10-2019-0013460

(51) Int. Cl.
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
CPC combination set(s) only.
See application file for complete search history.

(56) References Cited

U.S. PATENT DOCUMENTS

| 7,116,780 | B2 | 10/2006 | Sun |
| 9,473,604 | B2 * | 10/2016 | Choi ..................... G06F 1/1656 |
| 10,205,807 | B2 | 2/2019 | Bae et al. |
| 10,206,490 | B2 | 2/2019 | Kang et al. |
| 10,398,039 | B2 | 8/2019 | Choi et al. |
| 10,432,768 | B2 | 10/2019 | Choi et al. |

(Continued)

FOREIGN PATENT DOCUMENTS

| CN | 202857192 U | 4/2013 |
| CN | 203217204 U | 9/2013 |

(Continued)

OTHER PUBLICATIONS

International Search Report dated May 8, 2020, issued in International Application No. PCT/KR2020/001317.

(Continued)

*Primary Examiner* — Lisa Lea-Edmonds
(74) *Attorney, Agent, or Firm* — Jefferson IP Law, LLP

(57) ABSTRACT

A housing of an electronic device and an electronic device are provided. The housing of an electronic device including at least one plate includes a first surface coupled to at least a portion of a plate of the at least one plate and facing a rear surface of the plate, and a member comprising a second surface being substantially perpendicular to the first surface and facing a side surface of the plate, and wherein the first surface comprises a protrusion protruding from the first surface toward the plate by a predetermined height, a first recess formed in from the first surface by a predetermined depth, and a second recess formed in from the first surface deeper than the first recess.

22 Claims, 9 Drawing Sheets

(56) References Cited

U.S. PATENT DOCUMENTS

| | | | |
|---|---|---|---|
| 10,594,847 | B2 | 3/2020 | Lee et al. |
| 10,736,226 | B2* | 8/2020 | Han ................... H05K 5/04 |
| 10,768,664 | B2* | 9/2020 | Cho .................. G06F 1/1605 |
| 11,051,416 | B2* | 6/2021 | Baek .................. H04M 1/0202 |
| 11,071,222 | B2* | 7/2021 | Han ................... G06F 1/1637 |
| 2011/0287812 | A1 | 11/2011 | Joo |
| 2014/0092336 | A1 | 4/2014 | Watanabe et al. |
| 2014/0268298 | A1 | 9/2014 | Hendriks et al. |
| 2015/0271941 | A1 | 9/2015 | Lu |
| 2016/0156755 | A1 | 6/2016 | Choi et al. |
| 2017/0187851 | A1 | 6/2017 | Jung et al. |
| 2017/0207516 | A1* | 7/2017 | Koo ................... H04M 1/0277 |
| 2018/0109659 | A1* | 4/2018 | Zhao .................. H04R 1/44 |
| 2018/0368274 | A1* | 12/2018 | Ha .................... H04M 1/0249 |
| 2020/0367379 | A1* | 11/2020 | Han ................... H05K 5/03 |
| 2021/0329800 | A1* | 10/2021 | Baek .................. H01Q 1/22 |

FOREIGN PATENT DOCUMENTS

| | | |
|---|---|---|
| CN | 103676312 A | 3/2014 |
| CN | 105208150 A | 12/2015 |
| CN | 106210183 A | 12/2016 |
| CN | 205983307 U | 2/2017 |
| CN | 106936952 A | 7/2017 |
| CN | 207833400 U | 9/2018 |
| CN | 108925073 A | 11/2018 |
| CN | 109076115 A | 12/2018 |
| JP | 2014-067916 A | 4/2014 |
| JP | 2014-135701 A | 7/2014 |
| KR | 10-2011-0127483 A | 11/2011 |
| WO | 2013/069212 A1 | 5/2013 |
| WO | 2014/130985 A2 | 8/2014 |
| WO | 2016/036407 A1 | 3/2016 |

OTHER PUBLICATIONS

Written Opinion dated May 8, 2020, issued in International Application No. PCT/KR2020/001317.

European Search Report dated Feb. 15, 2022; European Appln No. 20748304.1-1216 / 3918887 PCT/KR2020001317.

Chinese Office Action with English translation dated Apr. 6, 2022; Chinese Appln. No. 202080011423.7.

* cited by examiner

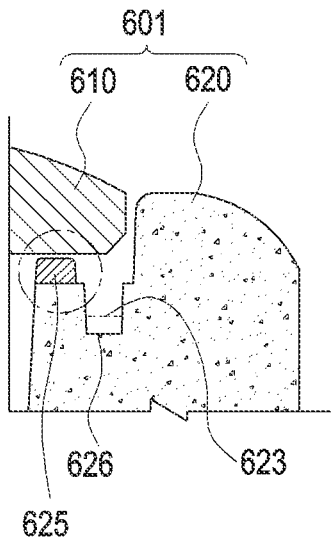 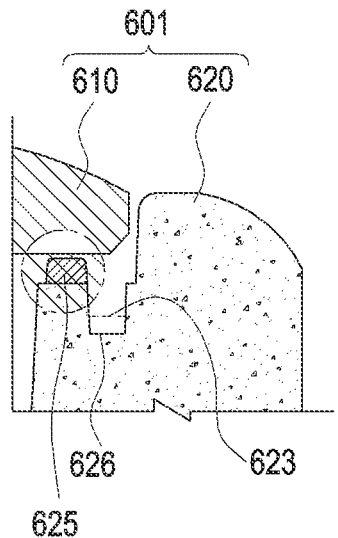 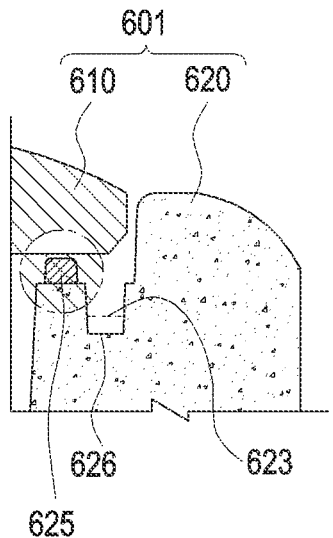
FIG.11A  FIG.11B  FIG.11C
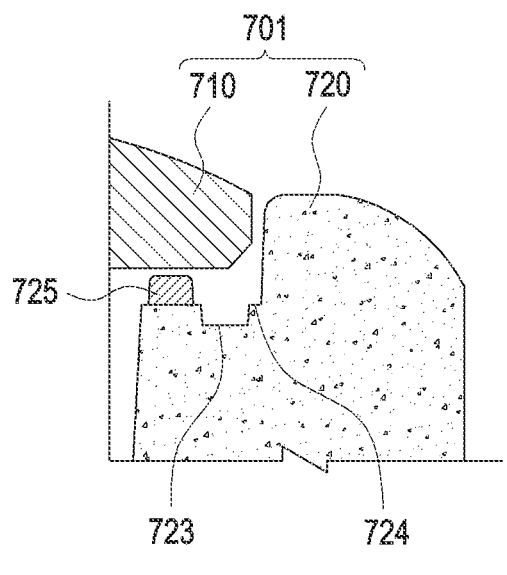 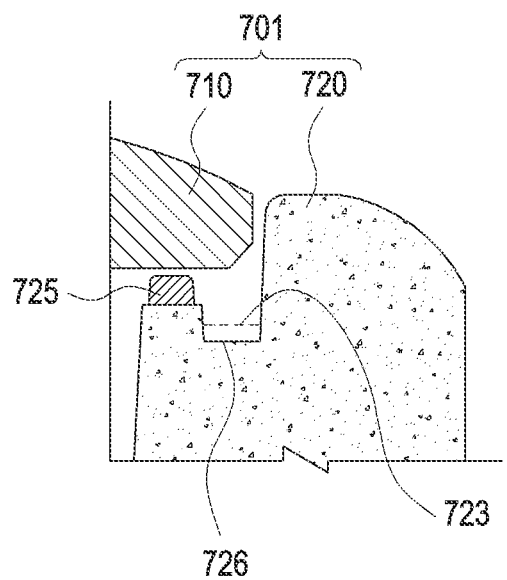
FIG.12A  FIG.12B

HOUSING AND ELECTRONIC DEVICE INCLUDING THE SAME

CROSS-REFERENCE TO RELATED APPLICATION(S)

This application is a continuation application of prior application Ser. No. 16/750,693 filed on Jan. 23, 2020, which has issued as U.S. Pat. No. 10,897,827 on Jan. 19, 2021; which is based on and claims priority under 35 U.S.C. § 119(a) of a Korean patent application number 10-2019-0013460 filed on Feb. 1, 2019, in the Korean Intellectual Property Office, the disclosure of which is incorporated by reference herein in its entirety.

BACKGROUND

1. Field

The disclosure relates to a housing of an electronic device and an electronic device including the same.

2. Description of Related Art

An electronic device (e.g., a mobile phone) can output stored information as a sound or an image. With the increase of the degree of integration and the popularization of hyper-speed and high-capacity wireless communication, recently, a single mobile communication terminal has various functions. For example, an entertainment function, such as games, a multimedia function, such as reproduction of music/video files, a communication and security function for mobile banking, etc., a scheduling function, an electronic wallet function, and the like, as well as a communication function, have been integrated in a single electronic device. As electronic devices can perform various functions, a plurality of various electronic components may be included in the interiors of the electronic devices.

In addition, in order to protect the electronic components from an external impact, the housings that define the external appearances of the electronic devices require high durability. When a housing of an electronic device is manufactured, at least one plate and members are coupled to each other to finish the external appearance of the electronic device. Various coupling methods may be used for coupling of at least one plate and members.

The above information is presented as background information only to assist with an understanding of the disclosure. No determination has been made, and no assertion is made, as to whether any of the above might be applicable as prior art with regard to the disclosure.

SUMMARY

Various components included in a housing of an electronic device may be coupled to each other by using an adhesive material. For example, when a plate and a member that supports the plate are coupled to each other, a method of applying an adhesive material to one side (e.g., an upper surface) of the member and assembling the plate on the member, to which the adhesive material is applied may be used.

In the case in which a liquid state adhesive material is used, an object to be bonded may be deformed due to pressing, and in some cases, a portion of the adhesive material may deviate from a bonding area of the object and overflow to the outside. When the housing of the electronic device is manufactured, the adhesive material overflowing to the outside of the housing may become a cause of lowering the appealing aspect of the external appearance of the electronic device.

In recent years, in an electronic device including a display, areas for seating bonding for a plate including the display have been gradually reduced due to the miniaturization of bezels (or black matrix (BM) areas). Meanwhile, in order to satisfy a bonding force required by the electronic device, a predetermined amount of adhesive material or more has to be used. According to some cases, because a predetermined amount of adhesive material or more is required to be used while an area for bonding of the electronic device decreases, it may be difficult to prevent the adhesive material from leaking to the outside of the electronic device.

Aspects of the disclosure are to address at least the above-mentioned problems and/or disadvantages and to provide at least the advantages described below. Accordingly, an aspect of the disclosure is to provide a housing of an electronic device that secures a proper amount of an adhesive material applied onto a coupling source for maintaining bonding force and prevents the adhesive material from overflowing to the outside of the electronic device housing, and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a first plate, a second plate facing an opposite direction of the first plate, and a side member attached to the second plate or integrally formed with the second plate, surrounding a space including at least one electronic component between the first plate and the second plate, and coupled to the first plate, wherein the side member includes: a first surface facing a rear surface of the first plate, and a second surface being substantially perpendicular to the first surface and facing a side surface of the first plate, and wherein the first surface comprises: a protrusion protruding upwards from the first surface such that the first plate is substantially seated on the first surface, a first recess disposed between the protrusion and the second surface and recessed from the first surface by a first depth along a lengthwise direction of the side member, and a second recess recessed from the first surface by a second depth along the lengthwise direction of the side member.

In accordance with another aspect of the disclosure, a housing of an electronic device including at least one plate is provided. The housing of an electronic device includes a member coupled to a rear surface of a plate of the at least one plate, wherein the member includes a first surface facing a rear surface of the plate, and a second surface disposed to be substantially perpendicular to the first surface and facing a side surface of the plate, and wherein the first surface comprises: a protrusion protruding upwards from the first surface such that the plate is substantially seated on the first surface, a first recess recessed from the first surface by a first depth along the lengthwise direction of the member, and a second recess recessed from the first surface by a second depth along the lengthwise direction of the member.

In accordance with another aspect of the disclosure, a housing of an electronic device including at least one plate is provided. The housing of an electronic device includes a first surface coupled to at least a portion of a plate of the at least one plate and facing a rear surface of the plate, and a member including a second surface being substantially perpendicular to the first surface and facing a side surface of the plate, and wherein the first surface comprises a protrusion protruding from the first surface toward the plate by a predetermined height, a first recess recessed from the first surface by a predetermined depth, and a second recess recessed from the first surface deeper than the first recess.

The housing of an electronic device and the electronic device according to various embodiments of the disclosure can prevent the adhesive material applied to the housing from overflowing while not reducing the amount of the adhesive material.

The housing of an electronic device and the electronic device according to various embodiments of the disclosure can prevent the adhesive material from overflowing through a structural method. Accordingly, the disclosure can prevent an appealing aspect of the external appearance of the electronic device from degrading in a process of manufacturing the electronic device housing.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 11A, 11B and 11C are views illustrating an arrangement form of protrusions according to various embodiments of the disclosure; and FIGS. 12A and 12B are views illustrating a cross-section of an electronic device housing according to various embodiments of the disclosure.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
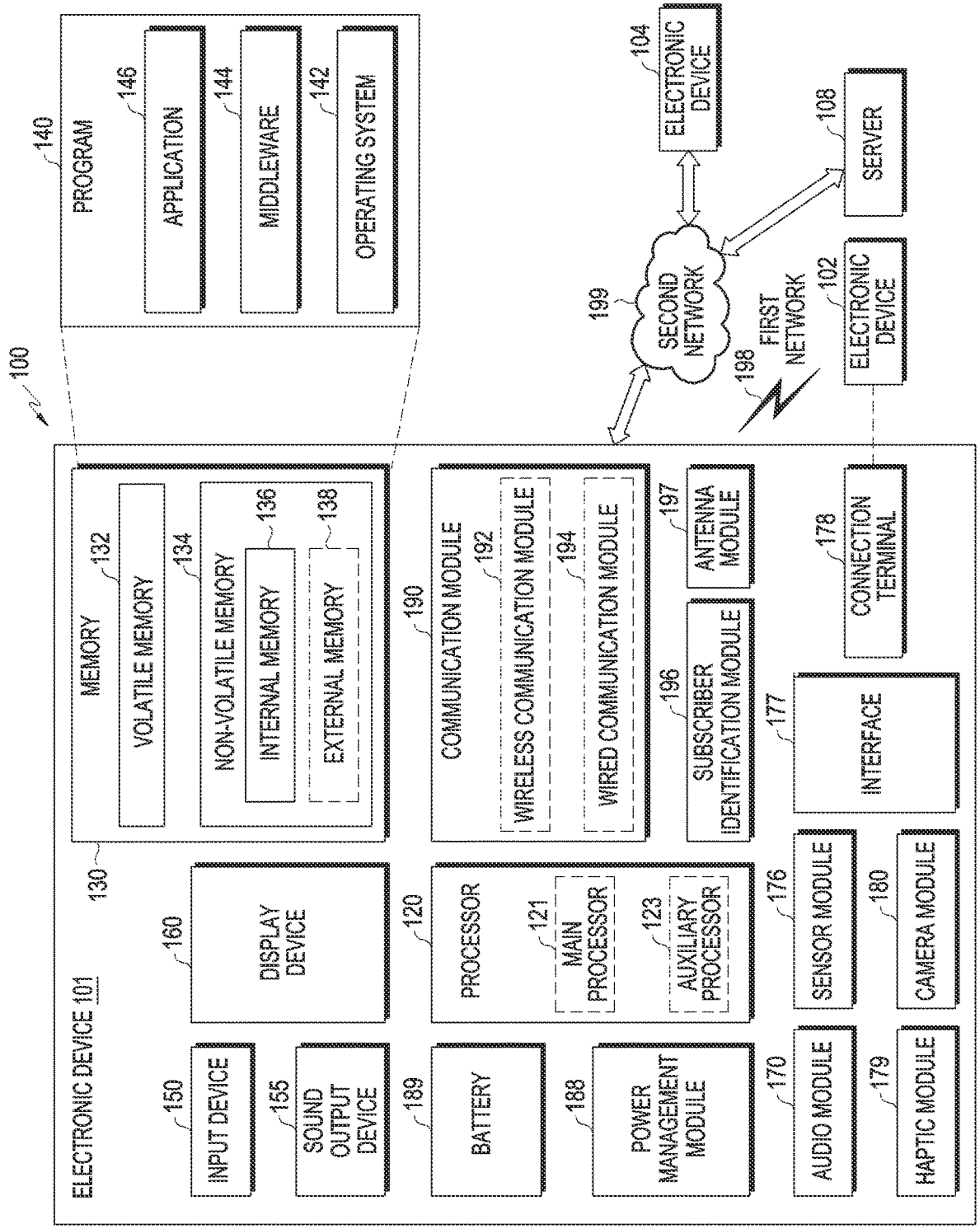
FIG. 1 is a block diagram of an electronic device in a network environment according to an embodiment of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
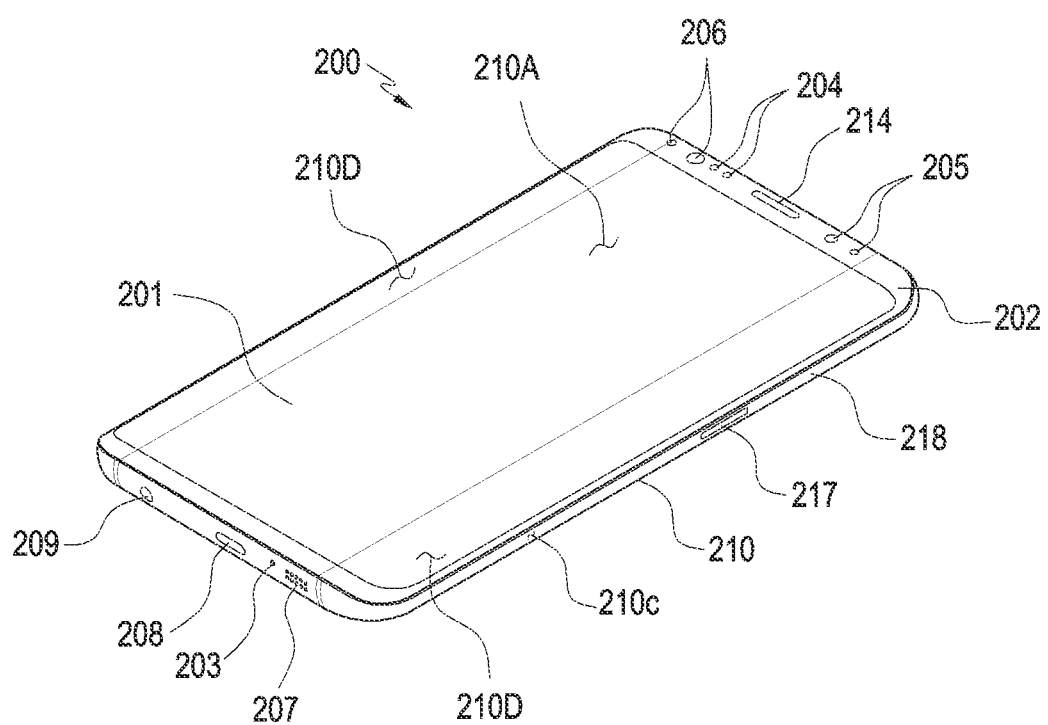
FIG. 2A is a front perspective view of an electronic device according to an embodiment of the disclosure.
Figure 2B:
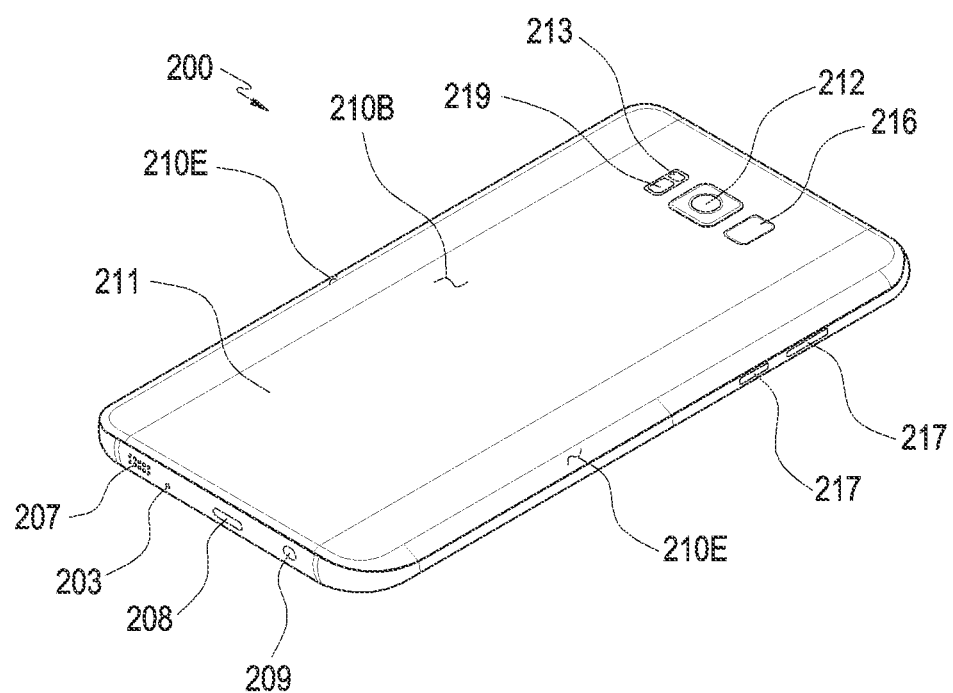
FIG. 2B is a rear perspective view of the electronic device according to an embodiment of the disclosure.

FIG. 2A is a front perspective view of an electronic device according to an embodiment of the disclosure. FIG. 2B is a rear perspective view of the electronic device according to an embodiment of the disclosure.

Referring to FIGS. 2A and 2B, an electronic device 200 (e.g., 101 of FIG. 1) according to an embodiment may include a housing 210 including a first surface (or a front surface) 210A, a second surface (or a rear surface) 210B, and a side surface 210C that surrounds a space between the first surface 210A and the second surface 210B. In another embodiment (not illustrated), the housing may refer to a structure that defines some of the first surface 210A, the second surface 210B, and the side surface 210C of FIG. 2A. According to an embodiment, the first surface 210A may be defined by a front plate 202 (e.g., a glass plate or a polymer plate including various coating layers), at least a portion of which is substantially transparent. The second surface 210B may be defined by a rear plate 211 that is substantially opaque. The rear plate 211, for example, may be formed of coated or colored glass, ceramics, a polymer, a metal (e.g., aluminum, stainless steel (STS), or magnesium), or a combination of at least two thereof. The side surface 210C may be coupled to the front plate 202 and the rear plate 211 and may be defined by a side bezel structure (or 'a side member') 218 including a metal and/or a polymer. In some embodiments, the rear plate 211 and the side bezel structure 218 may be integrally formed and may include the same material (e.g., a metallic material such as aluminum).

In the illustrated embodiment, the front plate 202 may include two first areas 210D that are deflected from the first surface 210A toward the rear plate 211 and extend seamlessly, at opposite ends of a long edge of the front plate 202. In the illustrated embodiment (see FIG. 2A), the rear plate 211 may include two second areas 210E that are deflected from the second surface 210B toward the front plate 202 and extend seamlessly, at opposite ends of a long edge of the rear plate 211. In some embodiments, the front plate 202 (or the rear plate 211) may include only one of the first areas 210D (or the second areas 210E). In other embodiments, some of the first areas 210D or the second areas 210E may not be included. In the embodiments, when viewed from a side of the electronic device 200, the side bezel structure 218 may have a first thickness (width) on a side surface on which neither the first areas 210D nor the second areas 210E are included and may have a second thickness that is smaller than the first thickness on a side surface on which the first areas 210D or the second areas 210E are included.

According to an embodiment, the electronic device 200 may include at least one of a display 201, audio modules 203, 207, 214, sensor modules 204, 216, and 219, camera modules 205, 212, and 213, a key input device 217, a light emitting element 206, and connector holes 208 and 209. In some embodiments, at least one (e.g., the key input device 217 or the light emitting element 206) of the elements may be omitted from the electronic device 200 or another component may be additionally included in the electronic device 200.

The display 201, for example, may be exposed through a corresponding portion of the front plate 202. In some embodiments, at least a portion of the display 201 may be exposed through the front plate 202 that defines the first surface 210A, and the first areas 210D of the side surface 210C. In some embodiments, corners of the display 201 may have a shape that is substantially the same as the adjacent outer shape of the front plate 202. In other embodiments (not illustrated), in order to expand the area, by which the display 201 is exposed, the intervals between the outskirts of the display 201 and the outskirts of the front plate 202 may be substantially the same.

In other embodiments (not illustrated), a portion of the screen display area of the display 201 may have a recess or an opening, and may include at least one of the audio module 214, the sensor module 204, the camera module 205, and the light emitting element 206, which are aligned with the recess or the opening. In other embodiments (not illustrated), at least one of the audio module 214, the sensor module 204, the camera module 205, the fingerprint sensor 216, and the light emitting element 206 may be included on the rear surface of the screen display area of the display 201. In other embodiments (not illustrated), the display 201 may be coupled to or be disposed to be adjacent to a touch detection circuit, a pressure sensor that may measure the strength (the pressure) of a touch, and/or a digitizer that detects a stylus pen of a magnetic field type. In some embodiments, at least a portion of the sensor modules 204 and 219 and/or at least a portion of the key input device 217 may be disposed in the first areas 210D and/or the second areas 210E.

The audio modules 203, 207, 214 may include a microphone hole 203 and speaker holes 207 and 214. A microphone for acquiring external sounds may be disposed in the microphone hole 203, and in some embodiments, a plurality of microphones may be disposed to detect the direction of a sound. The speaker holes 207 and 214 may include an external speaker hole 207 and a communication receiver hole 214. In some embodiments, the speaker holes 207 and 214 and the microphone hole 203 may be realized by one hole or a speaker may be included while speaker holes 207 and 214 are not employed (e.g., a piezoelectric speaker).

The sensor modules 204, 216, and 219 may generate an electrical signal or a data value corresponding to an operational state of the interior of the electronic device 200 or an environmental state of the outside. The sensor modules 204, 216, and 219, for example, may include a first sensor module 204 (e.g., a proximity sensor) and a second sensor module (not illustrated) (e.g., a fingerprint sensor) disposed on the first surface 210A of the housing 210, and/or a third sensor module 219 (e.g., a heart rate monitor (HRM) sensor) and/or a fourth sensor module 216 (e.g., a fingerprint sensor) disposed on the second surface 210B of the housing 210. The fingerprint sensor may be disposed not only on the first surface 210A (e.g., the display 201) but also the second surface 210B of the housing 210. The electronic device 200 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor.

The camera modules 205, 212, and 213 may include a first camera device 205 disposed on the first surface 210A of the electronic device 200, and a second camera device 212 and/or a flash 213 disposed on the second surface 210B. The camera devices 205 and 212 may include one or a plurality of lenses, an image sensor, and/or an image signal processor. The flash 213, for example, may include a light emitting diode or a xenon lamp. In some embodiments, two or more lenses (an infrared ray camera, and a wide angle/telephoto lens), and image sensors may be disposed on one surface of the electronic device 200.

The key input device 217 may be disposed on the side surface 210C of the housing 210. In another embodiment, the electronic device 200 may not include some or all of the above-mentioned key input devices 217 and the key input devices 217 which are not included, may be realized in different forms, such as a soft key, on the display 201. In some embodiments, the key input device may include a sensor module 216 disposed on the second surface 210B of the housing 210.

The light emitting device 206, for example, may be disposed on the first surface 210A of the housing 210. The light emitting element 206, for example, may provide state information on the electronic device 200 in the form of light. In other embodiments, the light emitting element 206, for example, may provide a light source that interworks with an operation of the camera module 205. The light emitting element 206, for example, may include a light-emitting diode (LED), an IR LED, and a xenon lamp.

The connector holes 208 and 209 may include a first connector hole 208 that may receive a connector (e.g., a USB connector) for transmitting and receiving electric power and/or data to and from an external electronic device, and/or a second connector hole (e.g., an earphone jack) 209 that may receive a connector for transmitting and receiving an audio signal to and from the external electronic device.

Figure 3:
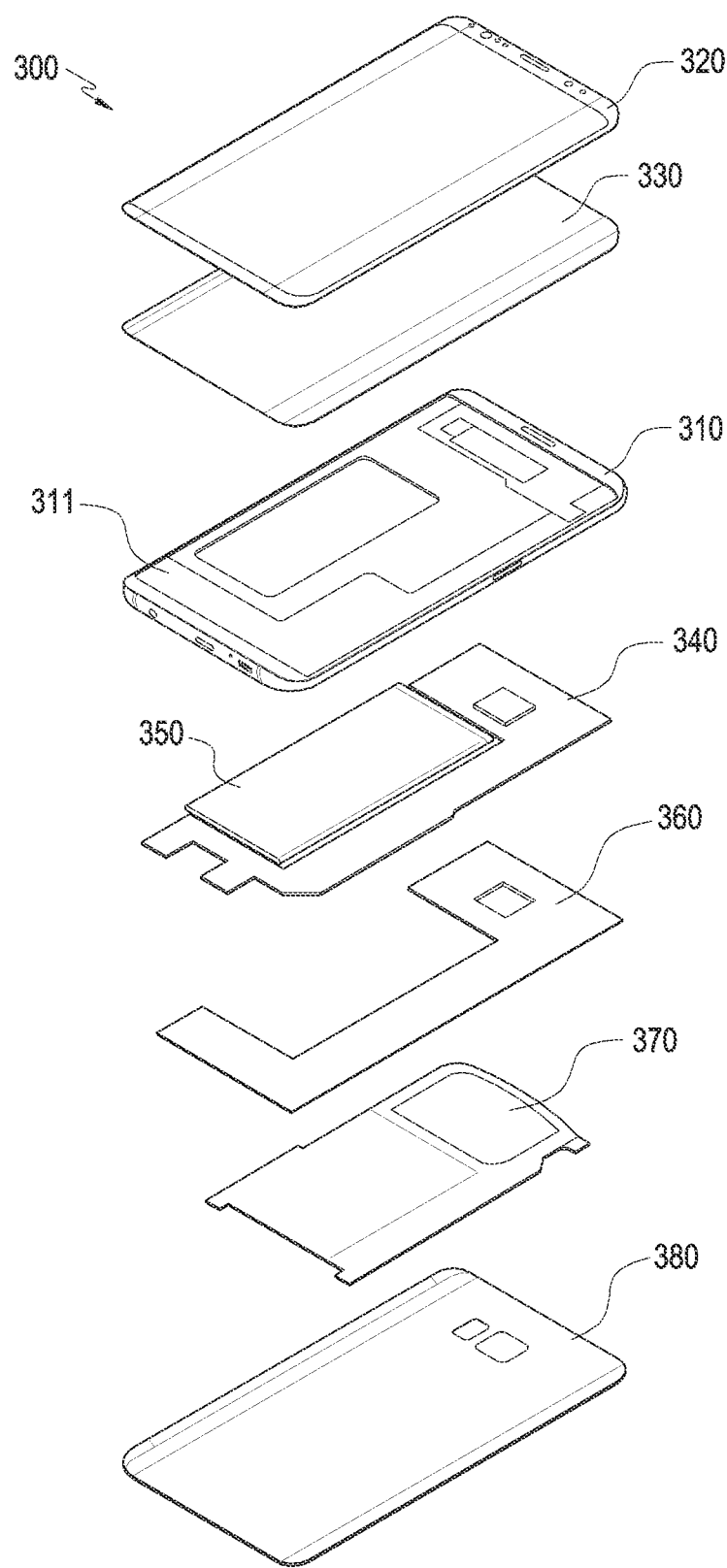
FIG. 3 is an exploded perspective view illustrating an electronic device according to an embodiment of the disclosure.

FIG. 3 is an exploded perspective view illustrating an electronic device according to an embodiment of the disclosure.

Referring to FIG. 3, an electronic device 300 (e.g., the electronic device 200 of FIG. 2A) may include a side bezel structure 310 (e.g., the side bezel structure 218 of FIG. 2A), a first support member 311 (e.g., the bracket), a front plate 320 (e.g., the front plate 202 of FIG. 2A), a display 330 (e.g., the display 201 of FIG. 2A), a printed circuit board 340, a battery 350, a second support member 360 (e.g., the rear case), an antenna 370, and a rear plate 380 (e.g., the rear plate 211 of FIG. 2B). In some embodiments, at least one (e.g., the first support member 311 or the second support member 360) of the elements may be omitted from the electronic device 300 or another component may be additionally included in the electronic device 300. At least one of the components of the electronic device 300 may be the same as or similar to at least one of the components of the wearable electronic device 200 of FIGS. 2A and 2B, and a repeated description thereof will be omitted.

The first support member 311 may be disposed in the interior of the electronic device 300 to be connected to the side bezel structure 310 or to be integrally formed with the side bezel structure 310. The first support member 311, for example, may be formed of a metallic material and/or a nonmetallic material (e.g., a polymer). The display 330 may be coupled to one surface of the first support member 311, and the printed circuit board 340 may be coupled to an opposite surface of the first support member 311. A processor, a memory, and/or an interface may be mounted on the printed circuit board 340. The processor, for example, may include one or more of a central processing unit, an application processor, a graphic processing unit, an image signal processor, a sensor hub process, or a communication processor.

The memory, for example, may include a volatile and/or nonvolatile memory.

The interface, for example, may include a high definition multimedia interface (HDMI), a universal serial bus (USB), an SD card interface, and/or an audio interface. The interface, for example, may electrically or physically connect the electronic device 300 to an external electronic device, and may include a USB connector, an SD card/memory card (MMC) connector, and an audio connector.

The battery 350 is a device for supplying electric power to at least one component of the electronic device 300, and for example, may include a primary battery that cannot be recharged, a secondary battery that may be recharged, or a fuel cell. At least a portion of the battery 350, for example, may be disposed on substantially the same plane as the printed circuit board 340. The battery 350 may be integrally disposed in the interior of the electronic device 300, and may be disposed to be detachable from the electronic device 300.

The antenna 370 may be disposed between the rear plate 380 and the battery 350. The antenna 370, for example, may include a near field communication (NFC) antenna, a wireless charging antenna, and/or a magnetic secure transmission (MST) antenna. The antenna 370, for example, may perform short-range communication with an external device or may wirelessly transmit and receive electric power that is used for charging. In another embodiment, an antenna structure may be formed by one or a combination of the side bezel structure 310 and/or the first support member 311.

Figure 4:
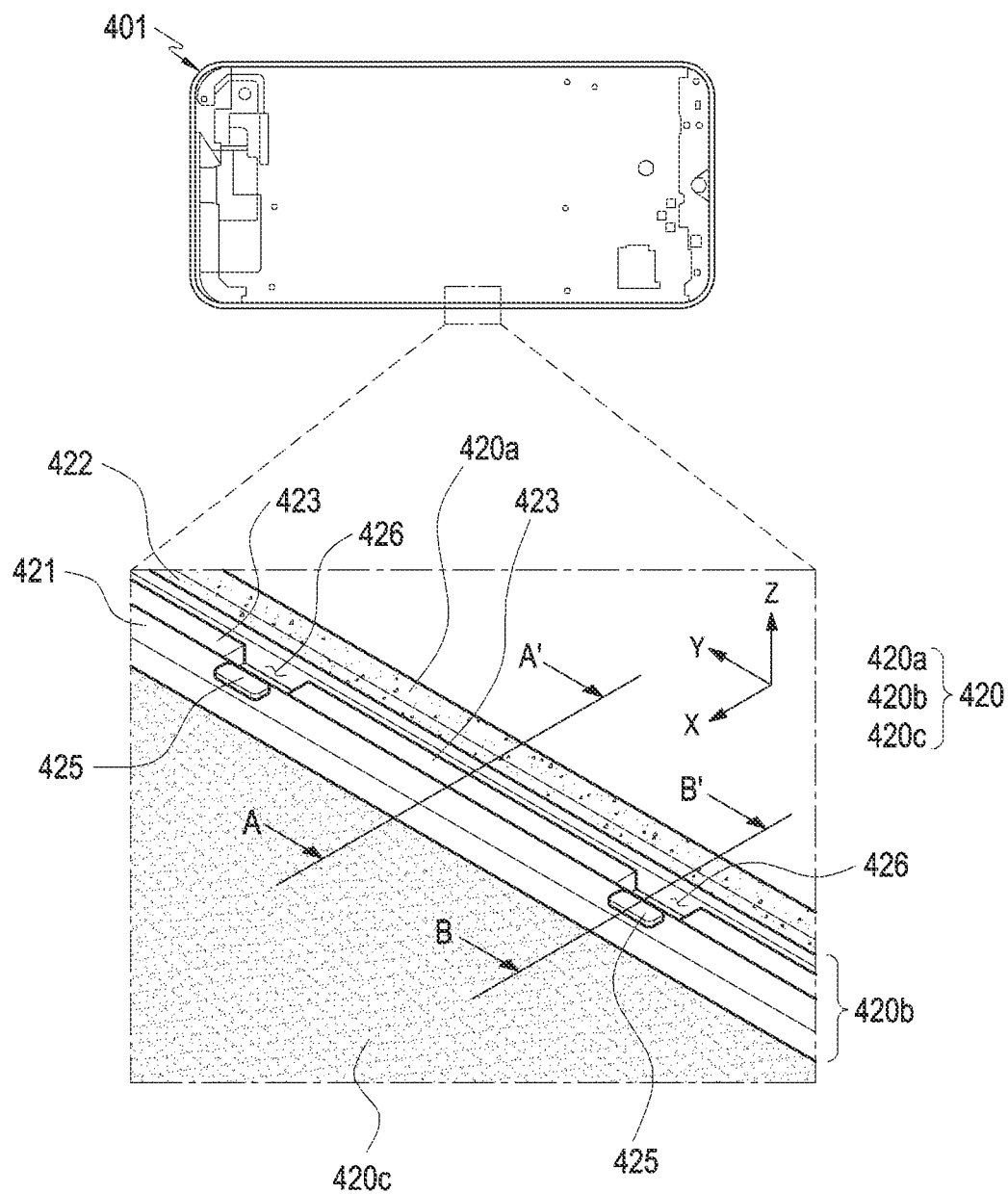
FIG. 4 is a view illustrating an electronic device housing and an enlarged perspective view of a portion thereof according to an embodiment of the disclosure.

FIG. 4 is a view illustrating an electronic device housing 401 and an enlarged perspective view of a portion thereof according to an embodiment of the disclosure.

An electronic device 400 (e.g., the electronic device 200 of FIG. 2A) according to various embodiments of the disclosure may include various forms of housings 401.

As described in FIGS. 2A to 3, the housing 401 may include a front plate (hereinafter, referred to as 'a first plate (or plate)'), a rear plate (hereinafter, referred to as 'a second plate (or plate)'), and a side bezel structure (hereinafter, referred to as 'a side member or a member').

The housing 401 according to various embodiments of the disclosure may be formed of a single material, or may be formed of a combination of at least two or more materials. Further, according to various embodiments, the housing 401 may be formed of a single component, but may be formed of at least two or more components.

Referring to FIG. 4, FIG. 4 illustrates a side member 420 as an example of the housing 401. The side member 420 according to the embodiment illustrated in FIG. 4 may be formed by coupling two or more materials. For example, the side member 420 may be a part formed of ceramics, a polymer, a metal, or a combination of at least two of the materials.

According to various embodiments, the side member 420 may include a first member 420a that constitutes an external appearance of the housing, and a second member 420b and/or a third member 420c located inside the first member 420a. According to an embodiment, the first member 420a may be an insert injection-molded part in the electronic device housing. The second member 420b may a part that is substantially the same as the first member 420a or the third member 420c, or may be a part that is separately formed from the first member 420a or the third member 420c. According to an embodiment, the first member 420a, the second member 420b, and the third member 420c may be substantially the same part.

Various forms according to various embodiments may be applied as the side member 420 of the disclosure. The diversities of the embodiments may be similarly applied to other configurations (e.g., the first plate and the second plate) of the housing 401 that is not illustrated in FIG. 4. Although it will be exemplified in the following description that the side member 420 is formed of a single material for convenience of description, it is noted that the disclosure is not limited thereto.

According to various embodiments, the side member (or the member) 420 of the electronic device housing 401 may include a coupling surface for coupling to (seating on) another portion of the housing 401. For example, referring to FIG. 4 again, the side member 420 may include a first surface 421 and a second surface 422. The first surface 421 may be another configuration of the housing 401, for example, a surface that faces one surface (e.g., the rear surface) of the plate (e.g., the first plate), and the second surface 422 may be another configuration of the housing, for example, a surface that faces an opposite surface (e.g., the side surface) of the plate (e.g., the first plate).

According to various embodiments, the first surface 421 and the second surface 422 may extend long along the lengthwise direction (e.g., a direction that is parallel to the y axis) of the side member 420.

According to various embodiments, a first recess 423 formed in from the first surface 421 of the side member 420 by a first depth along the lengthwise direction (e.g., a direction that is parallel to the y axis) of the side member 420 may be disposed on the first surface 421 of the side member 420.

As in the embodiment illustrated in FIG. 4, according to various embodiments of the disclosure, similarly to the first surface 421 that extends long along the lengthwise direction (e.g., the direction that is parallel to the y axis) of the side member 420, the first recess 423 also extends long along the lengthwise direction (e.g., the direction that is parallel to the y axis) of the side member 420. According to an embodiment, the first recess 423 may have a shape that is partially broken on the first surface 421, but according to another embodiment, may extend long integrally on the first surface 421.

According to various embodiments, a protrusion 425 that protrudes upwards from the first surface 421 may be disposed on the first surface 421 of the side member 420. The protrusion 425 may be a part on which a plate (e.g., the first plate) is substantially seated.

According to various embodiments of the disclosure, a second recess 426 formed in from the first surface 421 of the side member 420 by a second depth along the lengthwise direction (e.g., a direction that is parallel to they axis) of the side member 420 may be disposed on the first surface 421 of the side member 420.

According to various embodiments, at least a portion of the second recess 426 may overlap the first recess 423. According to an embodiment, as illustrated in FIG. 4, in a state in which the entire portion of the second recess 426 overlaps the first recess 423, the second recess 426 may have a shape which is formed in deeper from the first recess 423.

According to various embodiments, a plurality of protrusions 425 may be disposed on the first surface 421. Here, the plurality of protrusions 425 may be disposed to be spaced apart from each other by a predetermined distance.

According to various embodiments, a plurality of second recesses 426 also may be disposed on the first surface 421. Here, the plurality of second recesses 426 may be disposed to be spaced apart from each other by a predetermined distance. According to various embodiments, the second recesses 426 may be disposed in correspondence to the locations of the protrusions 425.

Figure 5:
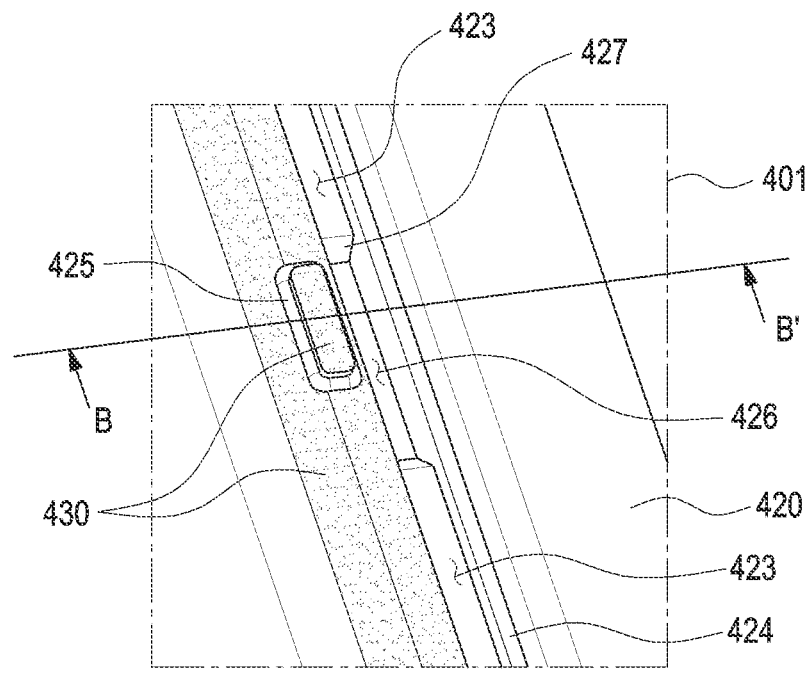
FIG. 5 is a view illustrating a state in which an adhesive material is applied to a side member according to an embodiment of the disclosure.

FIG. 5 is a view illustrating a state in which an adhesive material 430 is applied to a side member 420 according to an embodiment of the disclosure.

Referring to FIG. 5, FIG. 5 may be a partially enlarged view of a portion at which the protrusions 425 and the second recesses 426 are disposed in the embodiment of FIG. 4.

FIG. 5 may illustrate a state before the adhesive material 430 flows into the first recess 423 and the second recess 426 after the adhesive material 430 is applied onto the first surface 421 and the protrusion 425.

According to various embodiments, an acryl adhesive or a silicon adhesive may be used as the adhesive material 430 of the disclosure. However, the disclosure is not limited thereto, but the kinds and compositions of the adhesive material 430 may be variously determined.

According to an embodiment, the adhesive material 430 may be applied long along the lengthwise direction (e.g., the direction that is parallel to the y axis of FIG. 4) of the side member 420, for example, from an upper end to a lower end of the side member 420.

The adhesive material 430 may be applied to at least one of the first surface 421 and the protrusion 425. The adhesive material 430 applied to the at least one of the first surface 421 and the protrusion 425 may flow into the first recess 423 and the second recess 426 and be solidified.

The additional description of the first recess 423 will be described in detail with reference to the embodiments starting from FIG. 6. The additional description of the protrusion 425 and the second recess 426 will be described in detail with reference to the embodiments starting from FIG. 7.

Figure 6:
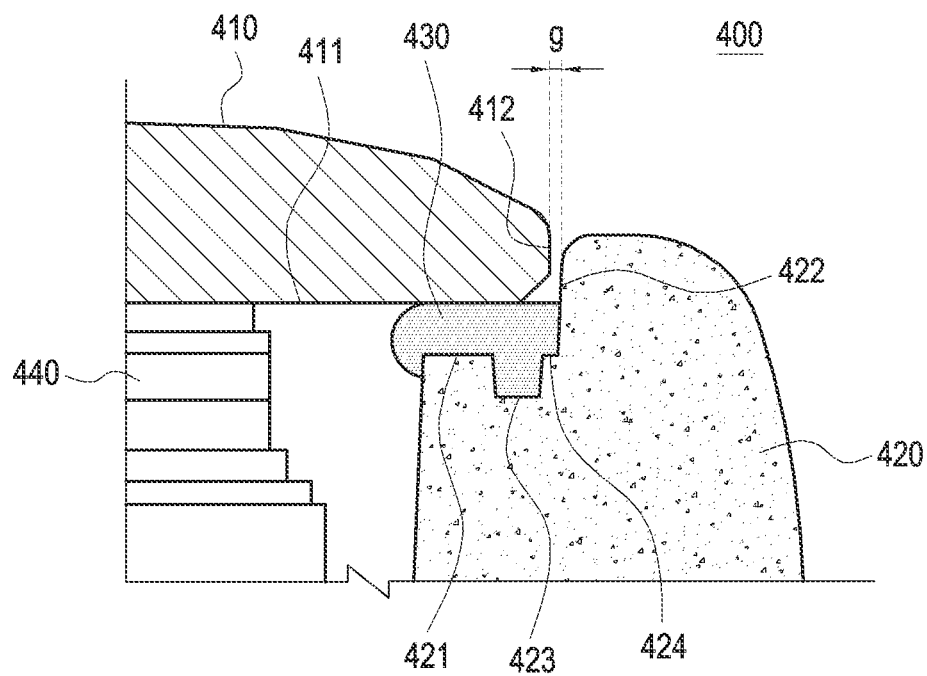
FIG. 6 is a view illustrating a state in which an adhesive material is interposed between a first plate and the side member according to an embodiment of the disclosure.

FIG. 6 is a view illustrating a state in which an adhesive material 430 is interposed between the first plate 410 and the side member 420 according to an embodiment of the disclosure. FIG. 6 illustrates a cross-section of the structure of the housing in the embodiment of FIG. 4, taken along direction A-A'.

Referring to FIG. 6, an electronic device 400 (e.g., the electronic device 200 of FIG. 2A) according to various embodiments of the disclosure may include a housing 401 (e.g., the housing 210 of FIG. 2A) that defines a space in the interior thereof, and at least one or more components (e.g., the component 440) disposed in the space.

The housing 401 may include a first plate 410, a second plate, and a side member 420.

According to various embodiments, the first plate 410 may be a front plate (e.g., the front plate 202 of FIG. 2A) (e.g., a glass plate including various coating layers, a polymer plate, or a ceramic plate), at least a portion of which is substantially transparent, or a rear plate (e.g., the rear plate 211 of FIG. 2B) (e.g., a plate disposed through a combination of at least two of coated or colored glass, ceramics, a polymer, a metal, or the materials), which is substantially opaque.

According to various embodiments, the second plate may be a plate which faces a direction that is opposite to the first plate 410 (or a direction that becomes farther away from the first plate 410). According to an embodiment, in the case in which the first plate 410 is a front plate (e.g., the front plate 202 of FIG. 2A) of the electronic device, the second plate may be a rear plate (e.g., the rear plate 211 of FIG. 2B) of the electronic device. According to another embodiment, the first plate 410 may be the rear plate (e.g., the rear plate 211 of FIG. 2B) of the electronic device 400, and the second plate may be the front plate (e.g., the front plate 202 of FIG. 2A) of the electronic device 400.

According to various embodiments, the side member 420 may correspond to a structure that is coupled to the first plate 410 and/or the second plate. According to an embodiment, the side member 420 may be coupled as a separate configuration of the second plate. According to another embodiment, the side member 420 may be a part that extends from a periphery of the second plate as an integral configuration with the second plate.

According to various embodiments, the side member 420 may include a first surface 421 that faces a rear surface 411 of the first plate 410, and a second surface 422 that faces a side surface of the first plate 410. The first surface 421 may face at least a portion of the rear surface 411 of the first plate 410, and the second surface 422 may face at least a portion of the side surface 412 of the first plate 410. According to an embodiment, the first surface 421 may face the same direction as the first surface (e.g., the first surface 210A of FIG. 2A) of the housing (e.g., the housing 210 of FIG. 2A).

According to an embodiment, an adhesive material 430 may be interposed between the first plate 410 and the side member 420. FIG. 6 may illustrate a state before the adhesive material 430 flows into the first recess 423 after the adhesive material 430 is applied onto the first surface 421 and the first protrusion 425. According to an embodiment, FIG. 6 may illustrate a state in which the adhesive material 430 is pressed. According to an embodiment, the adhesive material 430 may be pressed in a process of coupling the first plate 410 and the side member 420, and may be solidified in a state in which at least a portion of the pressed adhesive material 430 is induced into the gaps (e.g., a gap g and the first recess 423) between the first plate 410 and the side member 420.

The first recess 423 may be disposed on the first surface 421 of the side member 420. The first recess 423 may be a part that is formed in from the first surface 421 by a first depth, and may be disposed at a portion at which the first surface 421 is connected to the second surface 422. In a state in which the adhesive material 430 is interposed between the first plate 410 and the side member 420, the adhesive material 430 pressed as the first plate 410 and the side member 420 are coupled to each other may be induced into the first recess 423. The adhesive material 430 induced into the first recess 423 may be solidified. When a physical impact is applied to the electronic device through the solidified adhesive material 430 or the electronic device falls, the first plate 410 and the side member 420 may maintain a firm external appearance without being separated.

Referring to FIGS. 5 and 6 together, according to various embodiments, the first recess 423 is disposed along the portion at which the adhesive material 430 is applied onto the first surface 421 of the side member 420, and the adhesive material 430 can be prevented from overflowing to the outside of the electronic device 400 as a portion of the pressed adhesive material 430 flows into the first recess 423 when the first plate 410 is seated on the first surface 421 of the side member 420.

According to an embodiment, when the first recess 423 is disposed on the first surface 421 of the side member 420, a visible state preventing structure 424 may be disposed between the first recess 423 and the second surface 422. A detailed description of the visible state preventing structure 424 will be described below with reference to FIG. 12.

Figure 7:
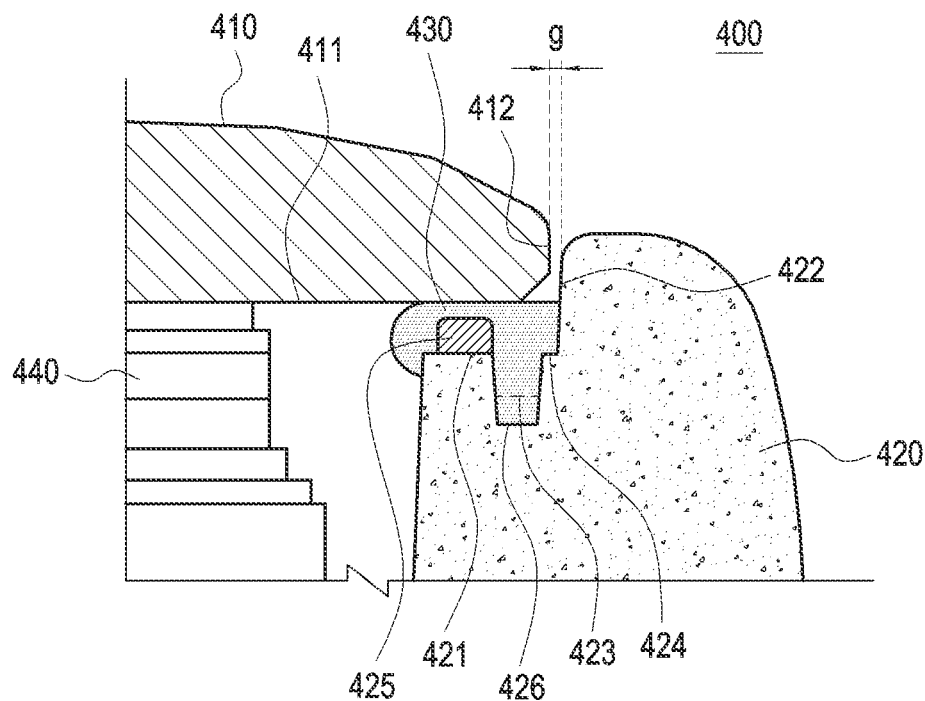
FIG. 7 is a view illustrating a state in which an adhesive material is interposed between the first plate and the side member according to an embodiment of the disclosure.

FIG. 7 is a view illustrating a state in which an adhesive material 430 is interposed between the first plate 410 and the side member 420 according to an embodiment of the disclosure. FIG. 7 illustrates a cross-section of the structure of the housing in the embodiment of FIG. 4, taken along direction B-B'.

FIG. 7 may illustrate a state in which the adhesive material 430 flows into the first recess 423 and the second recess 426 after the adhesive material 430 is applied onto the first surface 421 and the protrusion 425. According to an embodiment, FIG. 7 may illustrate a state in which the adhesive material 430 is pressed similarly to the embodiment of FIG. 6.

Referring to FIG. 7, according to various embodiments, the side member 420 may include a first surface 421 and a second surface 422, and a first recess 423 may be disposed on the first surface 421. Unlike the embodiment of FIG. 6, a protrusion 425 and a second recess 426 may be disposed on the first surface 421 of the side member 420 of the disclosure.

The protrusion 425 may be a part at which a rear surface 411 of the first plate 410 is substantially seated, and may protrude from the first surface 621 by a predetermined height while having a predetermined length and a predetermined width. According to some embodiments, because the adhesive material 430 is formed of a liquid state material, and the distance between the objects to be bonded may not be constant according to the degree by which the objects are pressed. If the side member 420 includes a protrusion 425, the distance between the first plate 410 and the side member 420 can be maintained constantly even if the distance between the first plate 410 and the side member 420 becomes shorter.

According to an embodiment, the protrusion 425 may be integrally formed with the first surface 421 or may be formed of a separate material from that of the first surface 421 and may be a part that is attached to the first surface 421 through a separate process.

According to an embodiment, the protrusion 425 may be located farther away from the second surface 422 than the first recess 423.

The adhesive material 430, as described with reference to FIG. 5, may be applied to both of the first surface 421 and an upper portion of the protrusion 425, and as the first plate and the side member 420 become closer, the adhesive material 430 applied to the upper portion of the protrusion 425 may be pressed earlier than the adhesive material 430 applied to the first surface 421 and may be pressed further than the adhesive material 430 applied to the first surface 421.

The second recess 426 may be a part that extends long along the lengthwise direction of the side member 420. Similarly to the feature that the first recess 423 extends long along the lengthwise direction of the side member 420, the second recess 426 also may extend long along the lengthwise direction of the side member 420.

According to various embodiments, at least a portion of the second recess 426 may overlap the first recess 423 on the first surface 421. The feature that the second recess 426 overlaps the first recess 423 may mean that the second recess 426 is formed in deeper from the first recess 423 in the height direction (e.g., the direction that is parallel to the z axis of FIG. 4) of the side member. For example, the first recess 423 may be formed in from the first surface 421 by a first depth (e.g., P1 of FIG. 8, which will be described below), and the second recess 426 may be formed in from the first surface 421 by a second depth (e.g., P1+P2 of FIG. 8, which will be described below).

In FIGS. 4, 5, and 7, the entire portion of the second recess 426 overlaps the first recess 423, and may be formed in further from the first recess 423. However, although not illustrated in the drawings, it should be noted that not the entire portion but only a portion of the second recess 426 may overlap the first recess 423.

Referring to FIGS. 5 and 7, the second recesses 426 may be disposed parallel to the protrusions 425 in correspondence to the locations of the protrusions 425. Because the second recesses 426 are disposed at a location corresponding to the locations of the protrusions 425, the adhesive material 430 applied onto the protrusions 425 may be induced into the second recesses 426. Because the second recesses 426 are disposed in parallel to the protrusions 425, the adhesive material 430 applied onto the protrusions 425 may be induced uniformly into the spaces defined by the second recesses 426 in a process of pressing the adhesive material 430. According to various embodiments, the second recesses 426 may include at least one inclined surface 427. The at least one inclined surface 427 may guide the adhesive material 430 applied onto the first surfaces 421 and the protrusions 425 such that the adhesive material 430 is induced uniformly into the spaces defined by the second recesses 426 in a process of pressing the adhesive material 430.

Referring to FIGS. 6 and 7 together, for example, when only the first recess 423 is present on the first surface 421 (e.g., the embodiment of FIG. 6), the adhesive material 430 applied onto the first surface 421 may flow into the recesses 423 and be solidified. In addition, if the protrusions 425 are further provided, the adhesive material 430 corresponding to the volume of the protrusions 425 may overflow between the gaps G and may hinder the appealing aspect of the external appearance of the electronic device as the adhesive material 430 overflows to the outside of the electronic device as compared with the embodiment (e.g., the embodiment of FIG. 6) in which no protrusion 425 is present.

According to various embodiments of the disclosure, because the adhesive material 430 located on the protrusions 425 is caused to flow into the second recesses 426 by additionally disposing the second recesses 426 at locations that are adjacent to the protrusions 425 (e.g., the embodiment of FIG. 7), the adhesive material 430 can be prevented from overflowing to the outside of the electronic device without limiting the amount of the adhesive material 430 applied to the area (or the space), to which the adhesive material 430 is bonded, according to the bonding area.

Figure 8:
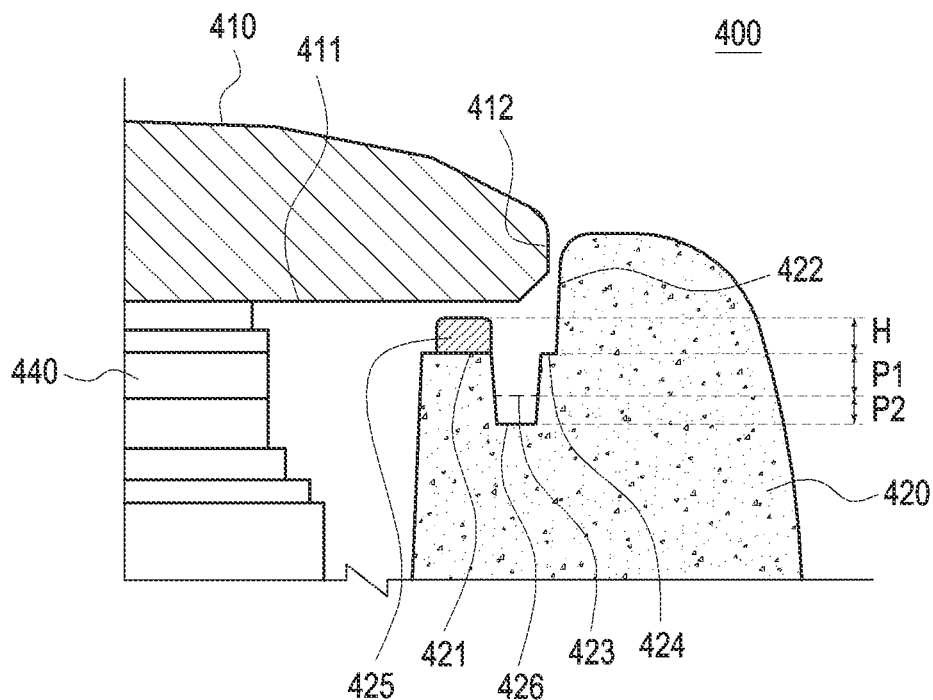
FIG. 8 is a view illustrating a cross-section of a housing according to an embodiment of the disclosure.

FIG. 8 is a view illustrating a cross-section of a housing 401 according to an embodiment of the disclosure.

Figure 9:
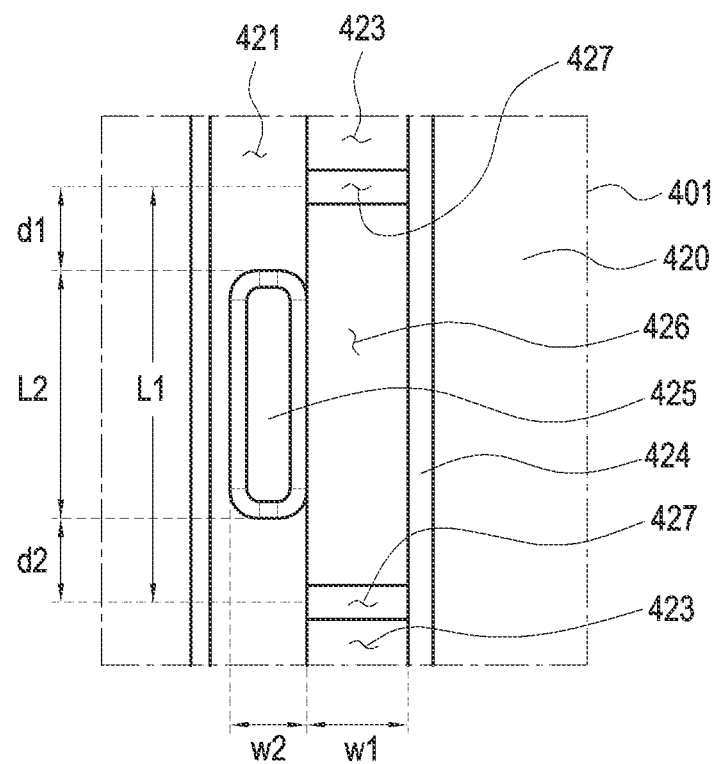
FIG. 9 is a view illustrating a side member according to the embodiment of FIG. 8, which is viewed from the top according to an embodiment of the disclosure.

FIG. 9 is a view illustrating a side member 420 according to the embodiment of FIG. 8, which is viewed from the top according to an embodiment of the disclosure.

Referring to FIGS. 8 and 9, the dimensions of the protrusions 425 and the second recesses 426 of the disclosure will be discussed.

According to various embodiments, the depth P2 of the spaces defined by the second recesses 426 is larger than the height H of the protrusions 425. The depth of the spaces defined by the second recesses 426 may be a depth obtained by subtracting the depth P1 of the space defined by the first recess 423 from the depth P1+P2, by which the second recesses 426 are formed in from the first surface.

According to various embodiments, when viewed from the top of the side member 420, the length L1 of the second recesses 426 may be larger than the length L2 of the protrusions 425. Because the length L1 of the second recesses 426 is longer than the length L2 of the protrusions 425, air pockets that may be generated around the inclined surfaces 427 of the second recesses 426 can be prevented when the adhesive material that is present on the protrusions 425 and/or the first surface 421 around them flows into the second recesses 426 and is solidified. For example, when the length L2 of the protrusion 425 is about from 0.5 mm to 0.8 mm, the length L1 of the second recesses may be about from 0.8 mm to 1.2 mm.

According to various embodiments, when viewed from the top of the side member 420, the ends of the second recesses 426 may be longer than the ends of the protrusions 425 by a first distance d1, and the opposite ends of the second recesses 426 may be longer than the opposite ends of the protrusions 425 by a second distance d2. Because the ends of the second recesses 426 are located at least on the outer side of the ends of the protrusions 425 from the center of an imaginary line (e.g., A-A' of FIG. 10, which will be described below) that passes through the protrusions 425 and the second recesses 426, the pressed adhesive material may be guided to flow into the second recesses 426 while being prevented from flowing in another direction. According to an embodiment, the first distance d1 and the second distance d2 may be the same length. For example, the first distance d1 and the second distance d2 may be 0.2 mm.

According to various embodiments, the width W1 of the second recesses 426 may be larger than the width W2 of the protrusions 425.

In summary, the volume of the second recesses 426 according to the width W1 and the length L1 of the second recesses 426, and the depth P2 of the spaces defined by the second recesses 426 may be larger than the volume of the protrusions 425 according to the width W2, the length L2, and the height of the protrusions 425.

According to an embodiment, the volume of the spaces defined by the second recesses 426 may be designed in proportion to the volume of the protrusions 425.

According to various embodiments of the disclosure, because that second recesses 426 that are larger than at least the protrusions 425 are additionally provided while the advantages of the provision of the protrusions 425 are utilized, the protrusions 425 can prevent the adhesive material 430 from overflowing to the outside of the electronic device.

Figure 10:
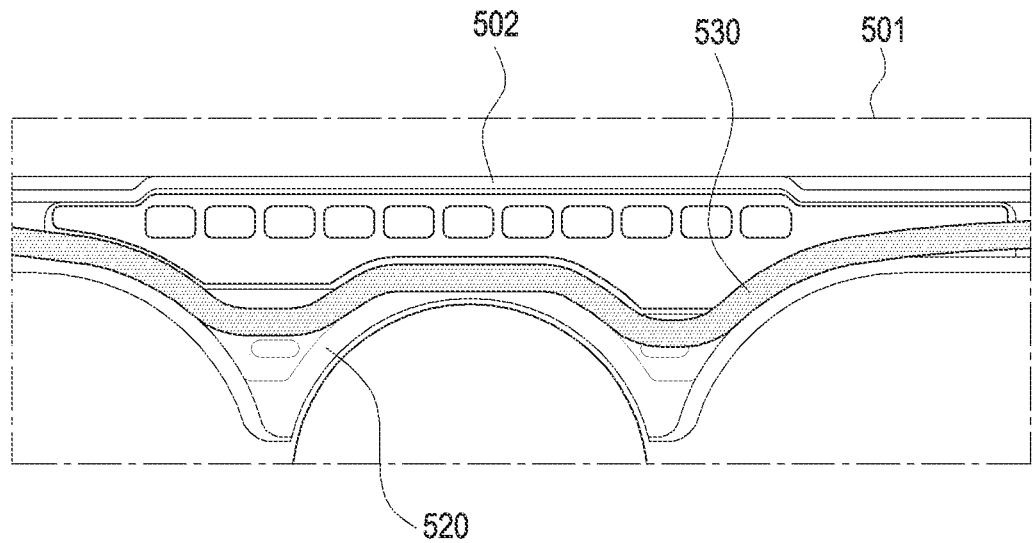
FIG. 10 is a view illustrating a cross-section of an electronic device housing according to an embodiment of the disclosure.

FIG. 10 is a view illustrating a cross-section of an electronic device housing 501 according to an embodiment of the disclosure.

According to various embodiments, a portion at which the adhesive material 530 is applied onto the side member 520 may not necessarily be to the first surface.

As described above through the embodiment of FIG. 4, according to various embodiments, the side member 520 may be not only a single material or a single component, but also a configuration in which dissimilar materials or dissimilar components are coupled.

According to various embodiments of the disclosure, the adhesive material 530 may not only be applied onto a surface of a single material or a single component but may also be applied to surfaces of dissimilar materials or dissimilar components. According to an embodiment, the adhesive material 530 may be also applied to the border between the dissimilar materials or the dissimilar components.

Referring to FIG. 10, the adhesive material 530 may be also applied to the deco member 502 disposed on the side member 520. The adhesive material 530 may overlap at least a portion of the deco member 502. In this way, the location of the adhesive material 530 may be various, unlike in the above-described embodiment. As illustrated in FIG. 10, the adhesive material 530 may not necessarily be disposed parallel to the lengthwise direction of the side member 520, but at least a portion of the adhesive material 530 may have a curved shape.

According to various embodiments, the protrusions (e.g., the protrusions 425 of FIG. 4), the first recess (e.g., the first recess 423 of FIG. 4), and the second recesses (e.g., the recesses 426 of FIG. 4) may be disposed along the area in which the adhesive material 530 is applied.

As described above, in correspondence to the various application locations and forms of the adhesive material 530 on the side member 520, the locations and forms of, the protrusions (e.g., the protrusions 425 of FIG. 4), the first recess (e.g., the first recess 723 of FIG. 4), and the second recesses (e.g., the recesses 426 of FIG. 8) may be variously designated. In addition, the various embodiments described above with reference to FIGS. 4 to 9 may be similarly applied to FIG. 10.

FIGS. 11A to 11C are views illustrating an arrangement form of protrusions 625 according to various embodiments of the disclosure.

According to various embodiments, the locations and forms of the protrusions 625 may be various according to embodiments. In FIGS. 11A to 11C, an electronic device housing 601 is shown having a first plate 610 (e.g., the first plate 410 of FIG. 7) and a side member 620 (e.g., the side member 420 of FIG. 7).

FIG. 11A may illustrate an embodiment in which the protrusions 625 are located at a periphery of the first surface (e.g., the first surface 421 of FIG. 7), FIG. 11B may illustrate an embodiment in which the protrusions 625 are located at an opposite periphery of the first surface (e.g., the first surface 421 of FIG. 7), and FIG. 11C may illustrate an embodiment in which the protrusions 625 are located at the center of the first surface (e.g., the first surface 421 of FIG. 7). Although not illustrated separately, various embodiments may be applied to the sectional shape of the protrusions 625 unlike those illustrated in the drawings.

Referring to FIGS. 11A to 11C, the protrusions 625 may be disposed close to an electronic component (e.g., the electronic component 440 of FIG. 7) on the first surface (e.g., the first surface 421 of FIG. 7) (e.g., FIG. 11A) and may be disposed close to the second surface (e.g., the second surface 422 of FIG. 7). Otherwise, the protrusions 625 may be disposed at the exact center of the first surface (e.g., the first surface 421 of FIG. 7).

The location of the protrusions 625 may be variously determined according to the volumes and the formed shapes of the first recess 623 and the second recesses 626.

FIGS. 12A and 12B are views illustrating a cross-section of an electronic device housing 701 according to various embodiments of the disclosure.

In FIGS. 12A and 12B, protrusions 725 may be disposed on the first surface (e.g., the first surface 421 of FIG. 7) and may be disposed close to the second surface (e.g., the second surface 422 of FIG. 7).

Referring to FIG. 12A, FIG. 12A may illustrate the electronic device housing 701 having a first plate 710 (e.g., the first plate 410 of FIG. 7) and a side member 720 (e.g., the side member 420 of FIG. 7), which is provided with a visible state preventing structure 724 in a state in which a second recess is not present.

Referring to FIG. 12B, FIG. 12B may illustrate the electronic device housing 701, from which the visible state preventing structure is removed when the second recesses 726 are present.

The visible state preventing structure 724, for example, may be a configuration for preventing the adhesive material induced into the first recess 723 and unevenly stuck to the first recess 723 from being visible from the outside. A gap (e.g., the gap g of FIG. 7) may be formed between one side (e.g., the side 412 of FIG. 7) of the first plate 710 and one side (e.g., the side 422 of FIG. 7) of the side member 720 after the first plate 710 and the side member 720 are coupled to each other, and the visible state preventing structure 724 may be provided to prevent the adhesive material unevenly induced into the interior of the first recess from being visible from the outside. The visible state preventing structure 724, according to an embodiment, can prevent the adhesive material unevenly induced into the interior of the first recess from being visible, by making the area of the visible state preventing structure 724 larger than that of the gap g.

According to an embodiment, by additionally disposing the second recesses 726, the possibility of the adhesive material induced into the recesses being unevenly solidified can be reduced. Accordingly, the embodiment in which the second recesses 726 are added can have an advantage of removing the visible state preventing structure 724 or reducing the size of the visible state preventing structure 724.

An electronic device according to various embodiments disclosed herein may be various types of devices. The electronic devices may include, for example, a portable communication device (e.g., a smart phone), a computer device, a portable multimedia device, a portable medical device, a camera, a wearable device, or a home appliance. According to an embodiment, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," or "connected with,", it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the invoked at least one instruction. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more components of the above-described components or operations may be omitted, or one or more other components or operations may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, an electronic device (e.g., the electronic device 400 of FIG. 7) may include: a first plate (e.g., the first plate 410 of FIG. 7); a second plate facing an opposite direction of the first plate; and a side member (e.g., the side member 420 of FIG. 7) attached to the second plate or integrally formed with the second plate, surrounding a space including at least one electronic component between the first plate and the second plate, and coupled to the first plate, the side member includes: a first surface (e.g., the first surface 421 of FIG. 7) facing a rear surface of the first plate; and a second surface (e.g., the second surface 422 of FIG. 7) being substantially perpendicular to the first surface and facing a side surface of the first plate, and the first surface has: a protrusion (e.g., the protrusion 425 of FIG. 7) protruding upwards from the first surface such that the first plate is substantially seated on the first surface; a first recess (e.g., the first recess 423 of FIG. 7) disposed between the protrusion and the second surface and formed in from the first surface by a first depth along a lengthwise direction of the side member; and a second recess (the second recess 426 of FIG. 7) formed in from the first surface by a second depth along the lengthwise direction of the side member.

According to various embodiments, when viewed from a top of the side member, at least a portion of the second recess may overlap the first recess.

According to various embodiments, the second recess may be disposed in parallel to the protrusion in correspondence to a location at which the protrusion is disposed.

According to various embodiments, when viewed from a top of the side member, a length of the second recess may be longer than a length of the protrusion.

According to various embodiments, when viewed from a top of the side member, one end of the second recess may be longer than one end of the protrusion by a first distance, and an opposite end of the second recess may be longer than an opposite end of the protrusion by a second distance.

According to various embodiments, the depth of the second recess may be greater than the height of the protrusion.

According to various embodiments, an adhesive material may be applied to at least one of the first surface or the protrusion, and the adhesive material applied to the at least one of the first surface or the protrusion may flow to the first recess and the second recess and be solidified.

According to various embodiments, a volume of the space defined by the second recess may be designed in proportion to an amount of the adhesive material applied to the protrusion.

According to various embodiments, a plurality of second recesses may be disposed in the first recess, and the plurality of second recesses may be spaced apart from each other by a predetermined distance.

According to various embodiments, at least some of the protrusions may overlap deco members disposed on the first surface.

According to various embodiments of the disclosure, a housing (e.g., the housing 401 of FIG. 7) of the electronic device including at least one plate may include a member (e.g., the member 420 of FIG. 7) coupled to a rear surface of a plate of the at least one plate, wherein the member includes: a first surface facing a rear surface of the plate; and a second surface (e.g., the second surface 422 of FIG. 7) disposed to be substantially perpendicular to the first surface and facing a side surface (e.g., the first surface 421 of FIG. 7) of the plate, and the first surface has: a protrusion (e.g., the protrusion 425 of FIG. 7) protruding upwards from the first surface such that the plate is substantially seated on the surface; a first recess (e.g., the first recess 423 of FIG. 7) formed in from the first surface by a first depth along a lengthwise direction of the member; and a second recess (the second recess 426 of FIG. 7) formed in from the first surface by a second depth along the lengthwise direction of the member.

According to various embodiments of the disclosure, a housing of an electronic device (e.g., the housing 401 of FIG. 7) including at least one plate may include: a first surface (e.g., the first plate 421 of FIG. 7) coupled to at least a portion of a plate of the at least one plate and facing a rear surface of the plate; and a member (e.g., the member 420 of FIG. 7) including a second surface (e.g., the second surface 422 of FIG. 7) being substantially perpendicular to the first surface and facing a side surface of the plate, and the first surface of the member has: a protrusion (e.g., the protrusion 425 of FIG. 7) protruding upwards from the first surface by a predetermined height; a first recess (e.g., the first recess of FIG. 7) formed in from the first surface by a predetermined depth; and a second recess (the second recess 426 of FIG. 7) formed in further from the first surface than the first recess.

According to various embodiments, the member (e.g., the member 420 of FIG. 7) may be a side member, and may be a part that is integrally formed with the second plate (e.g., the second plate 211 of FIG. 2B) or is separately formed.

According to various embodiments, the member (e.g., the member 420 of FIG. 7) may be coupled to at least one plate included in the electronic device. According to an embodiment, the least one plate may correspond to the first plate (e.g., the first plate 410 of FIG. 7). According to another embodiment, the second plate (e.g., the second plate 211 of FIG. 2B) may correspond to the plate, and another plate included in another electronic device may correspond to the plate.

It is noted by those skilled in the art to which the disclosure pertains that the wireless charging devices that wirelessly transmit electric power according to various embodiments of the disclosure, which have been described above, are not limited by the above-mentioned embodiments and the drawings, but may be variously replaced, modified, and changed without departing from the scope of the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first plate;
a second plate facing an opposite direction of the first plate; and
a side member attached to the second plate or integrally formed with the second plate, surrounding a space between the first plate and the second plate, and coupled to the first plate,
wherein at least one electronic component is accommodated in the space,
wherein the side member comprises:
a first surface facing a rear surface of the first plate; and
a second surface substantially perpendicular to the first surface and facing a side surface of the first plate,
wherein a protrusion protrudes toward the rear surface of the first plate from the first surface,
wherein a first recess is formed adjacent to the protrusion and is formed in from the first surface by a first depth, and
wherein a second recess is formed spaced apart from the protrusion and is formed in from the first surface by a second depth.

2. The electronic device of claim 1, wherein, when viewed from a top of the side member, at least a portion of the second recess overlaps the first recess.

3. The electronic device of claim 1, wherein the second recess is disposed in parallel to the protrusion in correspondence to a location at which the protrusion is disposed.

4. The electronic device of claim 1, wherein, when viewed from a top of the side member, a length of the second recess is longer than a length of the protrusion.

5. The electronic device of claim 1, wherein, when viewed from a top of the side member, one end of the second recess is longer than one end of the protrusion by a first distance, and an opposite end of the second recess is longer than an opposite end of the protrusion by a second distance.

6. The electronic device of claim 1, wherein a volume of a space, in which the second recess is disposed, is one of larger than, or same as, a volume of the protrusion.

7. The electronic device of claim 1,
wherein an adhesive material is applied to at least one of the first surface or the protrusion, and
wherein the adhesive material applied to the at least one of the first surface or the protrusion is flown to the first recess and the second recess, and is solidified.

8. The electronic device of claim 1, wherein a plurality of second recesses is disposed on the first surface, the plurality of second recesses being spaced apart from each other by a distance.

9. The electronic device of claim 8, wherein the plurality of second recesses is disposed in the first recess.

10. The electronic device of claim 1, wherein the side member is formed of at least two materials, and is configured through coupling of two or more components.

11. The electronic device of claim 1, wherein a depth of the second recess is greater than a height of the protrusion.

12. A housing of an electronic device comprising at least one plate, the housing comprising:
a member coupled to a rear surface of a plate of the at least one plate,
wherein the member comprises:
a first surface facing a rear surface of the plate; and
a second surface disposed to be substantially perpendicular to the first surface and facing a side surface of the plate,
wherein a protrusion protrudes toward the rear surface of the plate from the first surface,
wherein a first recess is formed adjacent to the protrusion and is formed in from the first surface by a first depth, and
wherein a second recess is formed spaced apart from the protrusion and is formed in from the first surface by a second depth.

13. The housing of claim 12, wherein, when viewed from a top of the member, at least a portion of the second recess overlaps the first recess.

14. The housing of claim 12, wherein the second recess is disposed in parallel to the protrusion in correspondence to a location at which the protrusion is disposed.

15. The housing of claim 12, wherein, when viewed from a top of the member, a length of the second recess is longer than a length of the protrusion.

16. The housing of claim 12, wherein, when viewed from a top of the member, one end of the second recess is longer than one end of the protrusion by a first distance, and an opposite end of the second recess is longer than an opposite end of the protrusion by a second distance.

17. The housing of claim 12, wherein a width of the second recess is larger than a width of the protrusion.

18. The housing of claim 12, wherein a depth of the second recess is greater than a height of the protrusion.

19. A housing of an electronic device comprising at least one plate, the housing comprising:
a first surface coupled to at least a portion of a plate of the at least one plate and facing a rear surface of the plate; and
a member comprising a second surface substantially perpendicular to the first surface and facing a side surface of the plate,
wherein a protrusion protrudes toward the rear surface of the plate by a height,
wherein a first recess is formed adjacent to the protrusion and is formed in from the first surface by a first depth, and
wherein a second recess is formed spaced apart from the protrusion and is formed in from the first surface by a second depth that is deeper than the first depth.

20. The housing of claim 19,
wherein an adhesive material is applied to at least one of the first surface or the protrusion, and
wherein the adhesive material applied to the at least one of the first surface or the protrusion is flown to the first recess and the second recess and is solidified.

21. The housing of claim 19, wherein the second recess is disposed in parallel to the protrusion in correspondence to a location at which the protrusion is disposed.

22. The housing of claim 19, wherein a plurality of second recesses is disposed on the first surface, the plurality of second recesses being spaced apart from each other by a distance.

* * * * *